(12) United States Patent
Zabroda

(10) Patent No.: US 8,766,726 B2
(45) Date of Patent: Jul. 1, 2014

(54) OPERATIONAL AMPLIFIER WITH IMPROVED FREQUENCY COMPENSATION

(75) Inventor: Oleksiy Zabroda, Constable, NY (US)

(73) Assignee: LSI Corporation, San Jose, CA (US)

( * ) Notice: Subject to any disclaimer, the term of this patent is extended or adjusted under 35 U.S.C. 154(b) by 47 days.

(21) Appl. No.: 13/572,284

(22) Filed: Aug. 10, 2012

(65) Prior Publication Data
US 2014/0043100 A1 Feb. 13, 2014

(51) Int. Cl.
*H03F 1/14* (2006.01)

(52) U.S. Cl.
USPC .......................................... 330/292; 330/261

(58) Field of Classification Search
USPC .................................. 330/292, 261, 253, 254
See application file for complete search history.

(56) References Cited

U.S. PATENT DOCUMENTS

| | | | |
|---|---|---|---|
| 6,977,490 B1 | 12/2005 | Zhang et al. | |
| 7,030,685 B1 | 4/2006 | Aram | |
| 7,049,894 B1 | 5/2006 | Aram | |
| 7,248,117 B1 | 7/2007 | Li et al. | |
| 7,414,473 B1 * | 8/2008 | Rayanakorn et al. | 330/255 |
| 7,576,610 B2 * | 8/2009 | Dalena | 330/260 |
| 7,646,247 B2 | 1/2010 | Dasgupta | |
| 7,907,003 B2 * | 3/2011 | Pulijala et al. | 327/541 |
| 7,986,188 B2 * | 7/2011 | Fujiwara | 330/292 |
| 2009/0295477 A1 | 12/2009 | Dasgupta | |

OTHER PUBLICATIONS

Ahuja, B. K., "An Improved Frequency Compensation Technique for CMOS Operational Amplifiers," IEEE Journal of Solid-State Circuits (1983) SC-18(6):629-633.
Hurst, P. J., et al., "Miller Compensation Using Current, Buffers in Fully Differential CMOS Two-State Operational Amplifiers," IEEE Transactions on Circuits and Systems—I: Regular Papers (2004) 51(2):275-285.
Mahattanakul, J., "Design Procedure for Two-Stage CMOS Operational Amplifiers Employing Current Buffer," IEEE Transactions on Circuits and Systems—II: Express Briefs (2005) 52(11):766-770.
Pugliese, A. et al., "Settling-Time-Oriented Design Procedure for Two-Stage Amplifiers with Current-Buffer Miller Compensation," 4th European Conference on Circuits and Systems for Communications Jul. 10-11, 2008 pp. 114-117.

* cited by examiner

*Primary Examiner* — Henry Choe
(74) *Attorney, Agent, or Firm* — Kevin Soules; Kermit D. Lopez; Luis M. Ortiz

(57) ABSTRACT

An operational amplifier includes an operational amplifier circuit having at least one output node and an output stage coupled to the output node, the output stage containing an output and first MOS transistor employed in a common source amplifier mode, a frequency compensation capacitor coupled between the output of the output stage and the gate of the first transistor circuit by means of a second MOS transistor employed in a common gate amplifier mode. The other node of the capacitor and the output of the output stage are coupled to the amplifier output node with a resistor.

17 Claims, 8 Drawing Sheets

US 8,766,726 B2

OPERATIONAL AMPLIFIER WITH IMPROVED FREQUENCY COMPENSATION

TECHNICAL FIELD

Embodiments are generally related to operational amplifiers, Embodiments are additionally related to operational amplifiers with indirect Miller-type frequency compensation topologies, which employ current buffers.

BACKGROUND OF THE INVENTION

Operational amplifiers are implemented in a variety of topologies including so-called indirect or Ahuja frequency compensation topologies, which employ current buffers. The most widely known introduction of operational amplifier with indirect frequency compensation of the output stage using a current buffer was derived by B. K. Ahuja. See, for example, B. K. Ahuja, "An Improved Frequency Compensation Technique for CMOS Operational Amplifiers," IEEE J. Solid-State Circuits, vol. SC-18, No. 6, pp. 629-633, December 1983, which is incorporated herein by reference. Thus, operation amplifiers of this type are often referred to as Ahuja or Ahuja-type amplifiers, components, frequency compensation, etc.

The Ahuja frequency compensation scheme is a well-known frequency compensation for operational amplifiers. The Ahuja frequency compensation was developed to improve upon the well-known Miller compensation, in which a capacitor is connected between the drain and the gate of the output transistor operating in common source amplifier mode. The Ahuja frequency compensation implements an indirect coupling of this capacitor by providing a current buffer which delivers the capacitor feedback signal to the gate of the output transistor of the amplifier.

FIG. 1(a) illustrates a schematic diagram of a prior art operational amplifier circuit 10 with a Miller compensation circuit. The circuit 10 shown in FIG. 1(a) includes a folded cascade input differential stage and an output stage. The input stage is generally composed of input transistors 20 and 24, active load transistors 18 and 22, and folded cascode transistors 12 and 28. Transistor 26 provides the input stage with the tail current. A cascoded current mirror composed of transistors 14, 16, 30, and 32 can perform the differential-to-single-ended signal conversion. The amplifier output stage is composed of cascoded MOS transistors 42 and 40 employed in common source amplification mode and an active load transistor 36. A frequency compensation capacitor 34 is connected between the amplifier output node 38 and the gate of the MOS transistor 42. Transistors 16, 26, 32, and 42 are connected to ground, while transistors 18, 22, and 36 are connected to the voltage $V_{DD}$.

FIG. 1(b) illustrates a schematic diagram of a prior art operational amplifier circuit 50 with an Ahuja-type compensation circuit. Note that in FIGS. 1(a)-1(b), similar parts or elements are generally identified by identical reference numerals. The circuit 50 of FIG. 1(b) is identical in structure to circuit 10 shown in FIG. 1(a) with only one difference, which is the connection of the frequency compensation capacitor 34. One node of the frequency compensation capacitor 34 remains connected to the amplifier output node 78, while the other node of the frequency compensation capacitor 34 is connected to the source of the folded cascade transistor 28. For the feedback signal provided by the frequency compensation capacitor 34, the transistor 28 is acting in a common gate amplification mode. Since transistor 28 is used as a path both for the amplified input signal and the feedback signal, the schematic of FIG. 1(b) deviates from the spirit of the original Ahuja circuit in which the feedback signal was delivered through a separate current buffer. This difference is not critical for the current invention.

FIG. 1(c) illustrates a Bode plot 90 of a prior art operational amplifier with Miller compensation. FIG. 1(d) illustrates a Bode plot 92 of a prior art operational amplifier with Ahuja-type compensation. FIG. 1(e) illustrates a plot 94 of the transient response of a prior art operational amplifier with Miller compensation. FIG. 1(f) illustrates a plot 96 of the transient response of a prior art operational amplifier with Ahuja-type compensation. FIG. 2 illustrates a Bode plot 100 of a prior art Ahuja-type internal compensation loop;

There are many advantages to the use of Ahuja frequency compensation applications circuits. FIGS. 1(a), 1(b), 1(c), 1(d), 1(e), 1(f) and FIG. 2 demonstrate some of these advantages while also indicating problems. The main advantage is a very significant increase in capacitive load driving capability.

One of the problems associated with Ahuja-type frequency compensation circuits is the use of the more complex internal feedback loop, which causes a ringing at the amplifier output. This significantly limits the use of an otherwise very effective compensation technique.

FIGS. 1(c) and 1(d) depict simulated Bode plots for these two schematics. The plot 90 of FIG. 1(c), which corresponds to the traditional Miller compensation of FIG. 1(a), demonstrates a lack of a phase margin at the unity gain frequency while the plot 92 of FIG. 1(d), which corresponds to Ahuja-type compensation circuit configuration of FIG. 1(b) demonstrates a phase margin greater than 80° at a unity gain frequency. The respective plots 94 and 96 of FIGS. 1(e) and 1(f) show a simulated transient response of the same schematics for the case when disturbances are applied through switched capacitors to the output nodes of the amplifiers connected in a 100% feedback configuration. As expected, the plot 94 of FIG. 1(e) corresponding to the Miller compensation with insufficient phase margin indicates quite significant ringing, but the Ahuja compensation with abundance of the phase margin on the frequency response demonstrates even more ringing at a much higher frequency (plot 96 of FIG. 1(f)).

This ringing is caused by the fact that Ahuja compensation, contrary to that of Miller compensation, has a frequency compensation internal feedback loop, which is not inherently stable. Such a loop is composed of two amplifying transistors: PMOS transistor MB (i.e., transistor 28 in FIG. 1(b)) connected in common gate configuration, and NMOS transistor MO (i.e., transistor 42 of FIG. 1(b)) connected in a common source configuration.

FIG. 2 illustrates a simulated Bode plot 100 of the Ahuja-type internal frequency compensation loop of the operational amplifier shown in FIG. 1(b). The lack of the phase margin (just 8 degrees) at the unity gain frequency is apparent. The phase margin deficiency of the frequency compensation loop is responsible for complex poles in the amplifier's transfer function and results in the ringing of the output signal.

In the frequency range where $1/R_L \gg \omega C_L \gg \omega C_m$ (where $R_L$ is the effective active load of the output stage, $\omega$ is radian frequency, $C_L$ is the load capacitance and $C_m$ is the frequency compensation capacitance), the loop has a phase margin close to 180°, but in the high frequency range where $\omega C_L \gg \omega C_m \geq G_m(M_b)$ (where $G_m(M_b)$ is the transconductance of the folded cascode transistor acting as a current buffer) two poles become dominant in the frequency response of the loop significantly deteriorating the phase margin.

In order to take full advantage of Ahuja compensation, the unity gain of this feedback loop has to be in this high frequency range. So far, it has never been an attempt to change the loop topology in order to mitigate its effect on the operational amplifier transient response but all efforts were directed upon optimization of its component parameters even in the most recent studies of the Ahuja compensation technique. As it is clearly seen in FIG. 1(f), however, this problem can significantly degrade the performance of the operational amplifier especially driving a switched capacitor load.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, the aspect of the disclosed embodiments to provide for an operation amplifier employing an Ahuja-type of the frequency compensation with improved stability of the internal frequency compensation feedback loop.

The aforementioned aspect and other objectives and advantages can now be achieved as described herein. An operational amplifier apparatus, method, and system are disclosed, which includes an operational amplifier circuit having at least one output node and an output stage coupled to the output node, the output stage containing an output and first MOS transistor circuit employed in a common source amplifier mode, a frequency compensation capacitor coupled between the output of the output stage and the gate of the first transistor circuit by means of a second MOS transistor employed in a common gate amplifier mode; the other node of the capacitor and the output of the output stage are coupled to the amplifier output node with a resistor.

The resistor (or resistors) improves the stability associated with the internal frequency compensation feedback loop while eliminating any ringing at the output of the operational amplifier circuit caused by a lack of a phase margin of the internal feedback loop.

Instead of MOS transistors, bipolar transistors could be equally employed in the operational amplifier. In this case the first transistor circuit is connected in a common emitter amplifier configuration while the other bipolar transistor is connected in a common base amplifier configuration.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete and will fully convey the scope of the invention to those skilled in the art. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

One goal of the disclosed embodiments is to eliminate ringing at the operational amplifier output caused by the lack of the phase margin of the internal frequency compensation loop. This goal can be achieved by introducing a resistor between output node of the operational amplifier and the output of the output stage, which is the common connection point of the drain node of the output transistor operating in common source mode and the local feedback capacitor. Two possible ways of connecting such a resistor are shown in FIG. 3.

Figure 1A:
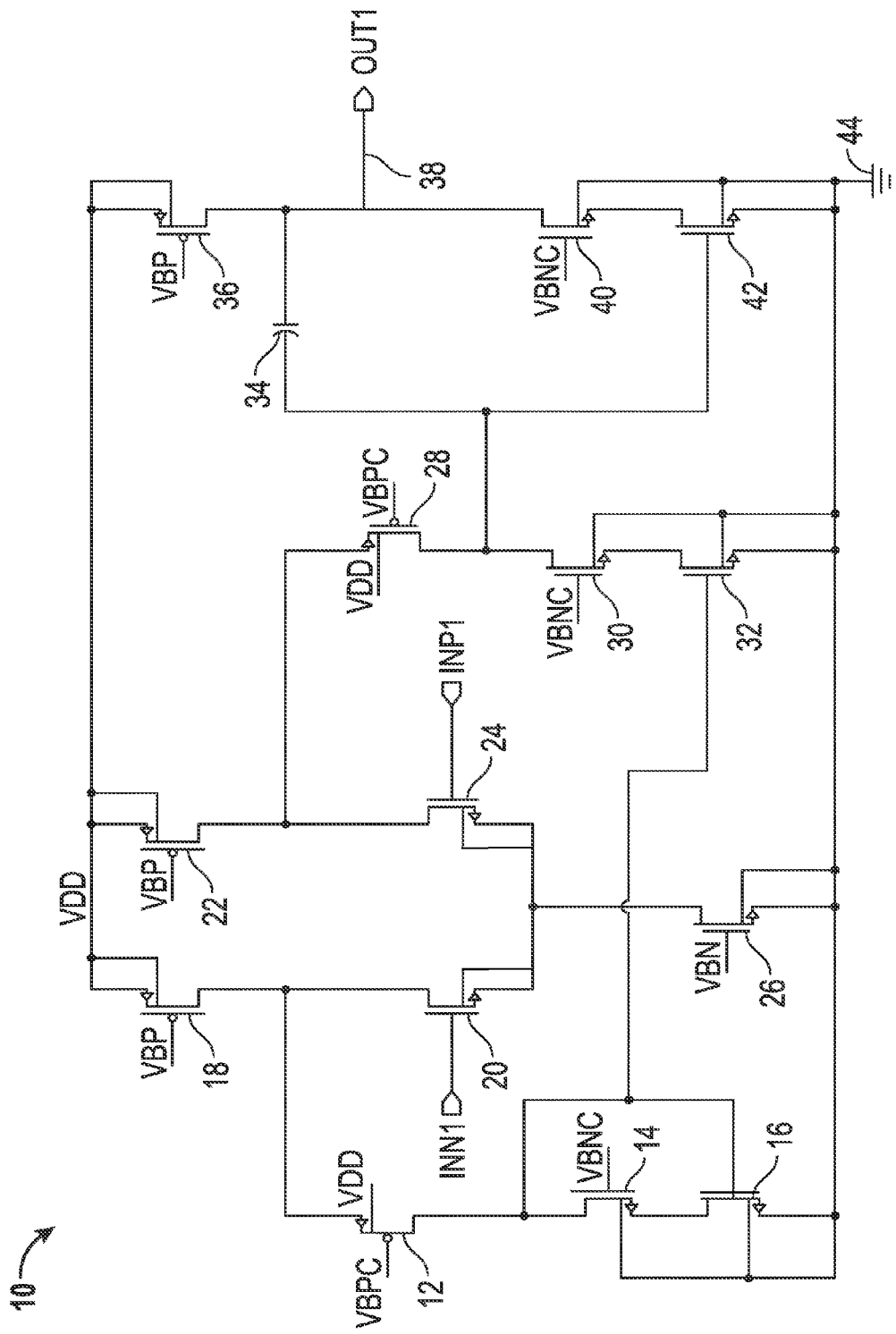
FIG. 1(a) illustrates a schematic diagram of a prior art operational amplifier with a Miller compensation circuit.
Figure 1B:
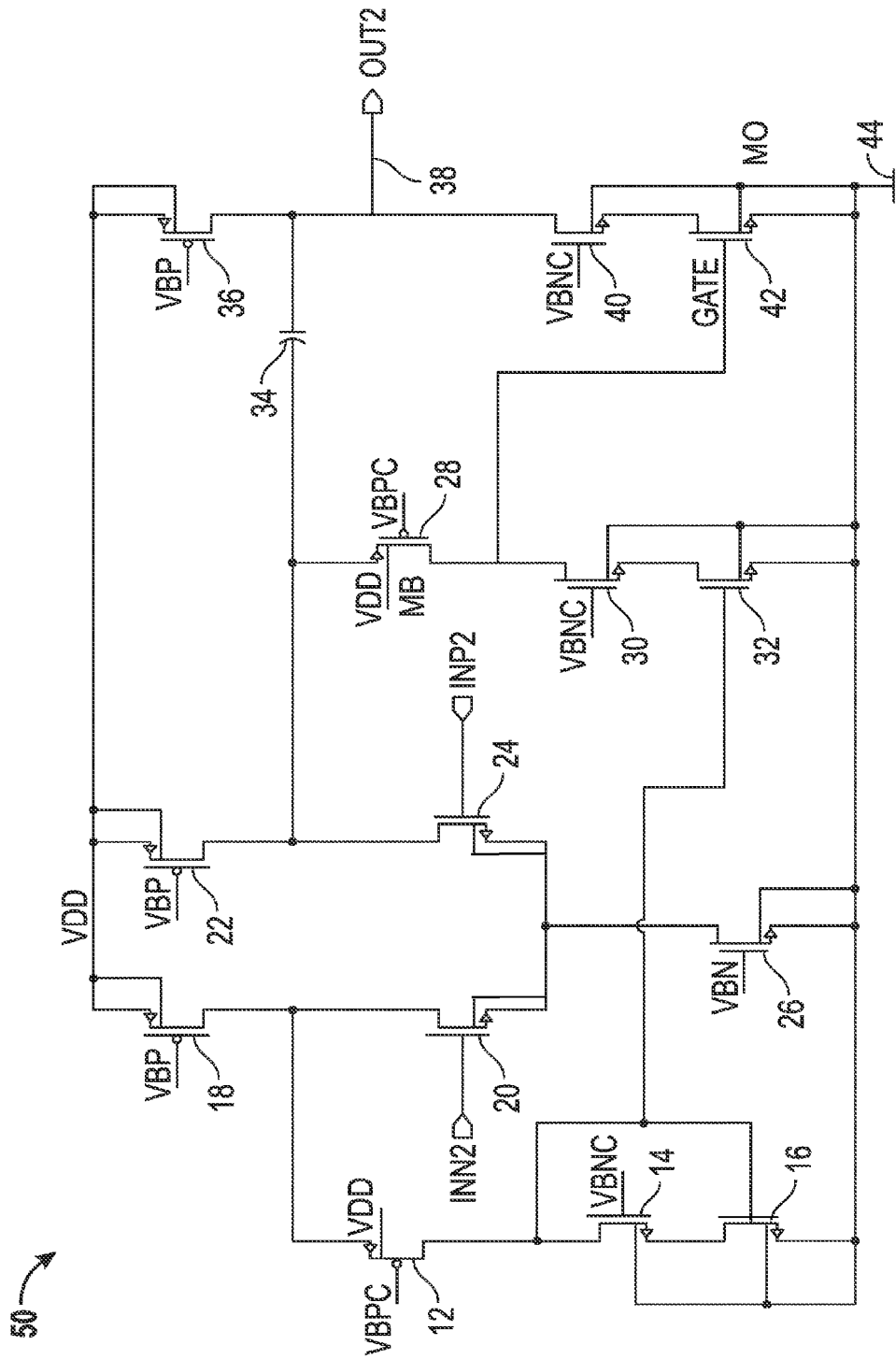
FIG. 1(b) illustrates a schematic diagram of a prior art operational amplifier with an Abuja-type compensation circuit.
Figure 1C:
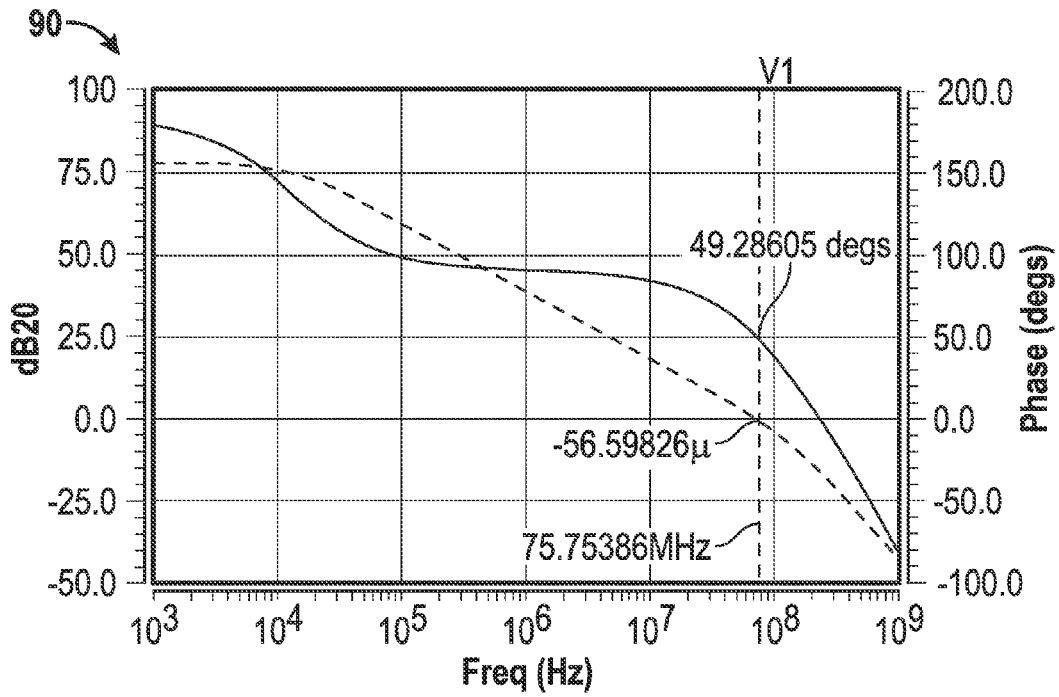
FIG. 1(c) illustrates a Bode plot of a prior art operational amplifier with Miller compensation.
Figure 1D:
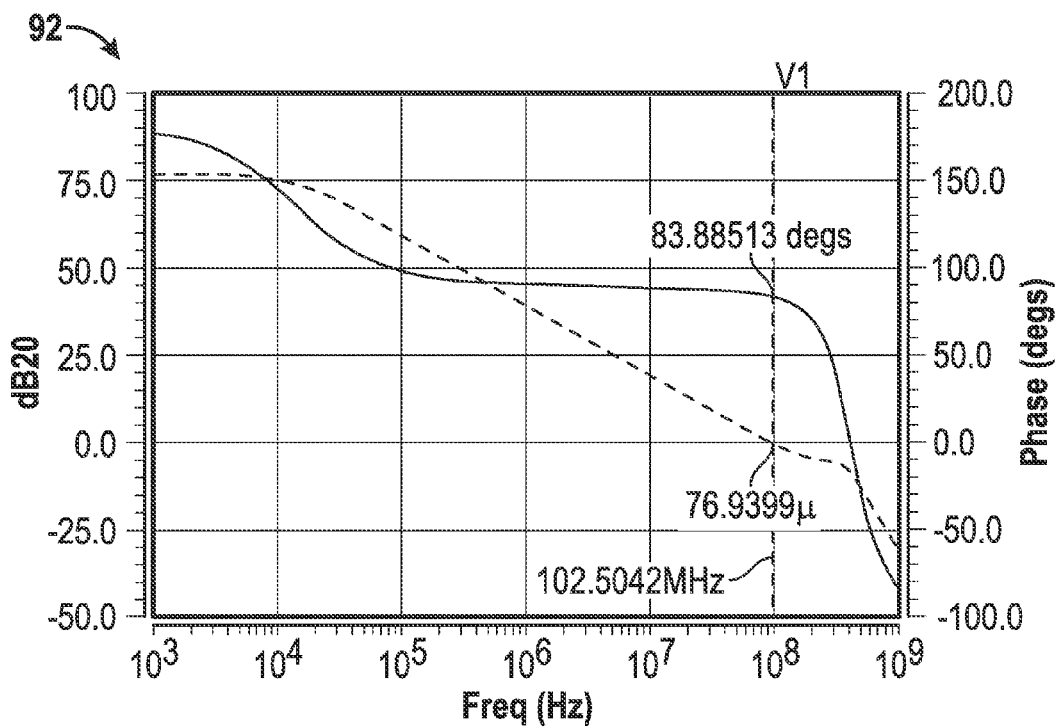
FIG. 1(d) illustrates a Bode plot of a prior art operational amplifier with Ahuja-type compensation.
Figure 1E:
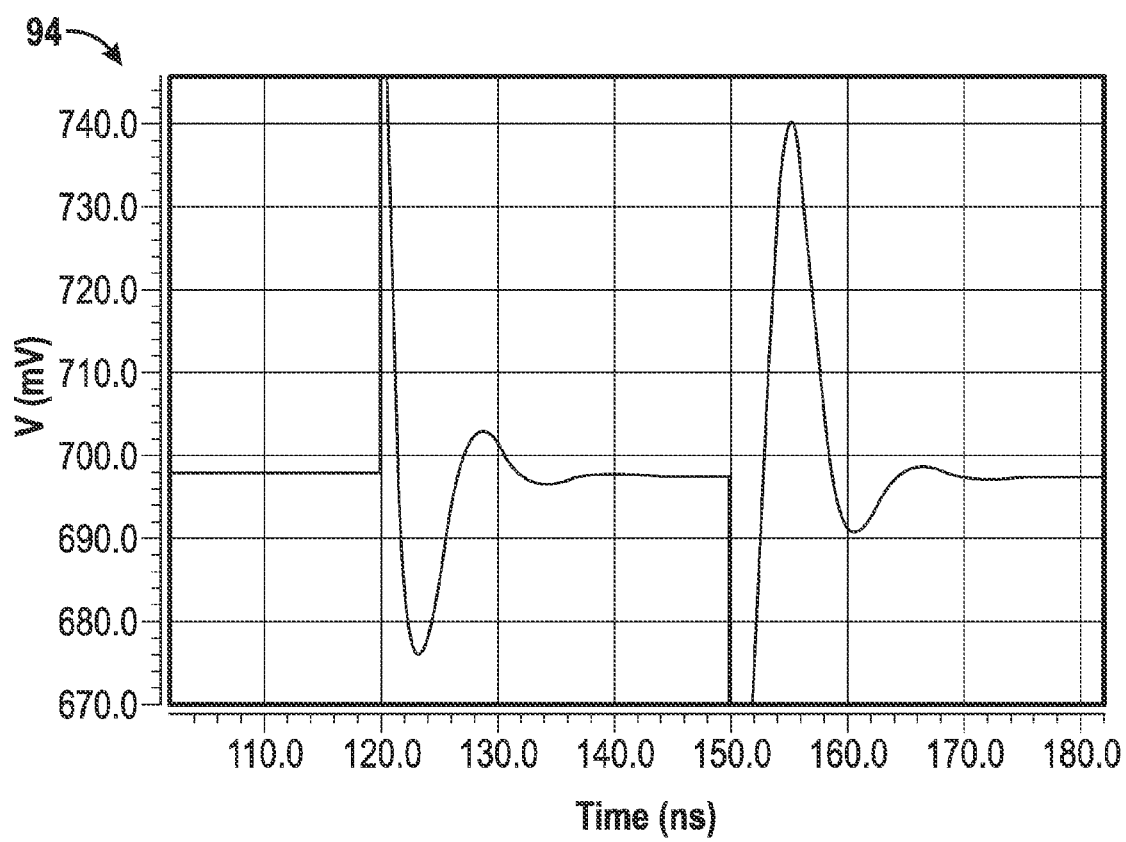
FIG. 1(e) illustrates a plot of the transient response of a prior art operational amplifier with Miller compensation.
Figure 3:
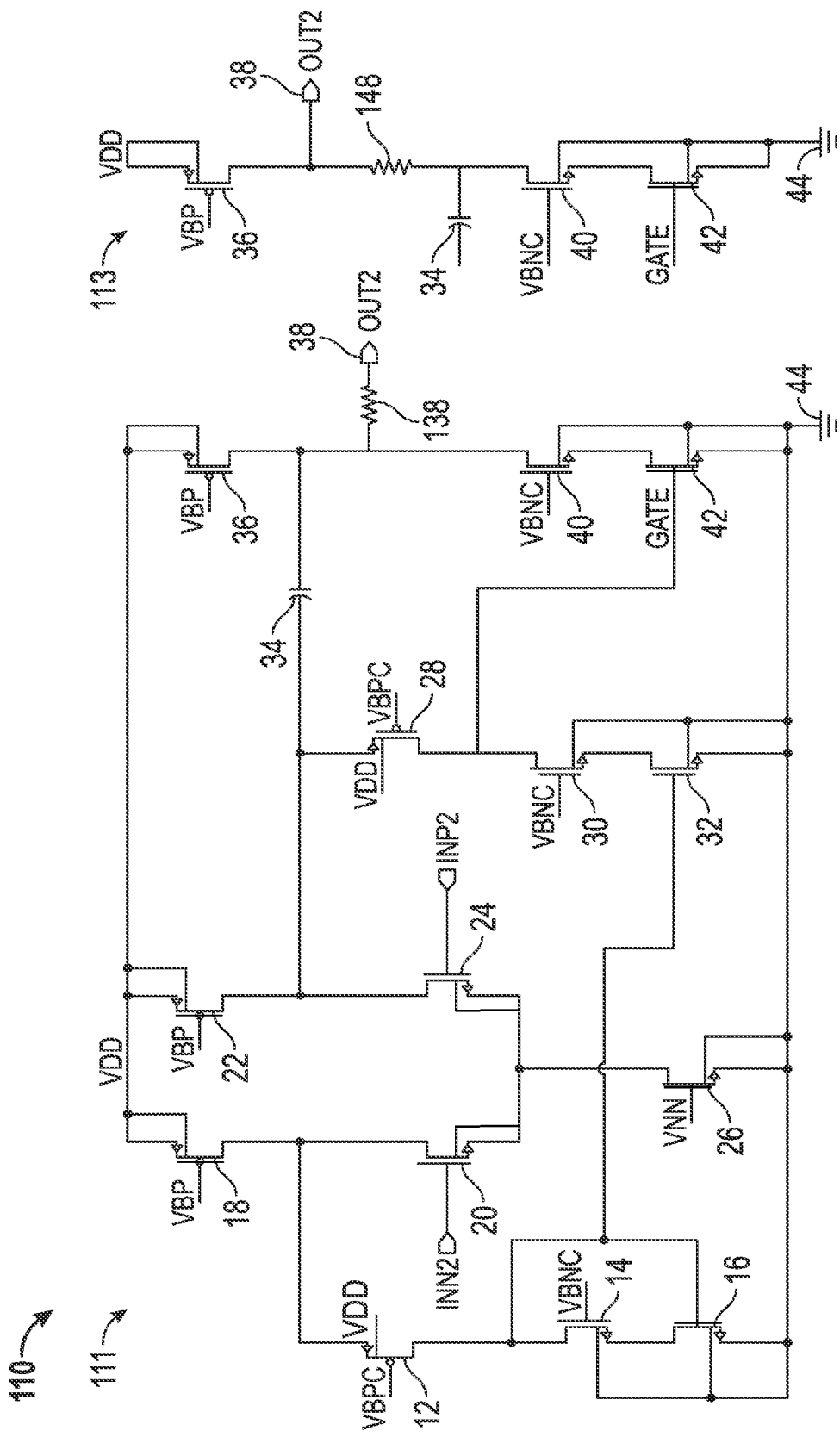
FIG. 3 illustrates a schematic diagram of an operational amplifier with improved stability of an internal Ahuja-type compensation loop circuit, in accordance with a preferred embodiment.

FIG. 3 illustrates a schematic diagram of an operational amplifier circuit 110 with improved stability of an internal Ahuja-type compensation loop circuit, in accordance with a preferred embodiment. The configuration of the amplifier is identical to one depicted in FIG. 1(b) with the exception of the resistor connected between the operational amplifier output node and the output of the output stage. Two options for connecting the aforementioned resistor include those respectively shown in circuit 111 and circuit 113. Note that in FIGS. 1(a), 1(b) and FIG. 3, identical or similar parts or components are generally indicated by identical reference numerals. For example, the amplifier output stage is composed of cascoded MOS transistors 42 and 40 (a first transistor circuit) employed in common source amplification mode and an active load transistor 36. Folded cascade transistor 28 can be a second transistor circuit.

In circuit 113 the active load transistor of the output stage (e.g., PMOS transistor 36, being a "third transistor circuit") can be directly connected to the output of the output stage. In this situation, the current associated with the load transistor does not flow through the additional resistor 138. In circuit 111, the active load transistor 36 is coupled to the output node of the operational amplifier by resistor 138 and the current associated with the load transistor creates an additional voltage drop across newly introduced resistor 138. The choice of the resistor connection option is based on the required output signal dynamic range of the operational amplifier. If the range should be as close to the power supply midpoint as possible, the option shown in schematic 111 is preferable. The option of schematic 113 is better suited, if the range should be close to the VDD.

The resistor (e.g. resistors 138 and 148) introduce a zero into the transfer function of the internal feedback loop, which mitigates the effect of the two dominant poles and improves the phase margin of the loop around the loop unity gain frequency. If the resistor value satisfies the following expression: R>=Cm/(CL*Gm(Mb)), the internal feedback loop will be stable enough not to create complex conjugated poles in the whole operational amplifier transfer function. The additional zero in the local feedback transfer function acts as another non-dominant pole of the whole amplifier transfer function. This pole and the zero, which is introduced by Ahuja-type compensation at the frequency ω=Gm(Mb)/Cm, mutually cancel each other resulting in a whole operational amplifier classical transfer function with one dominant pole and one non-dominant pole as it can be seen from the Bode plot 210 shown in FIG. 5.

Figure 4:
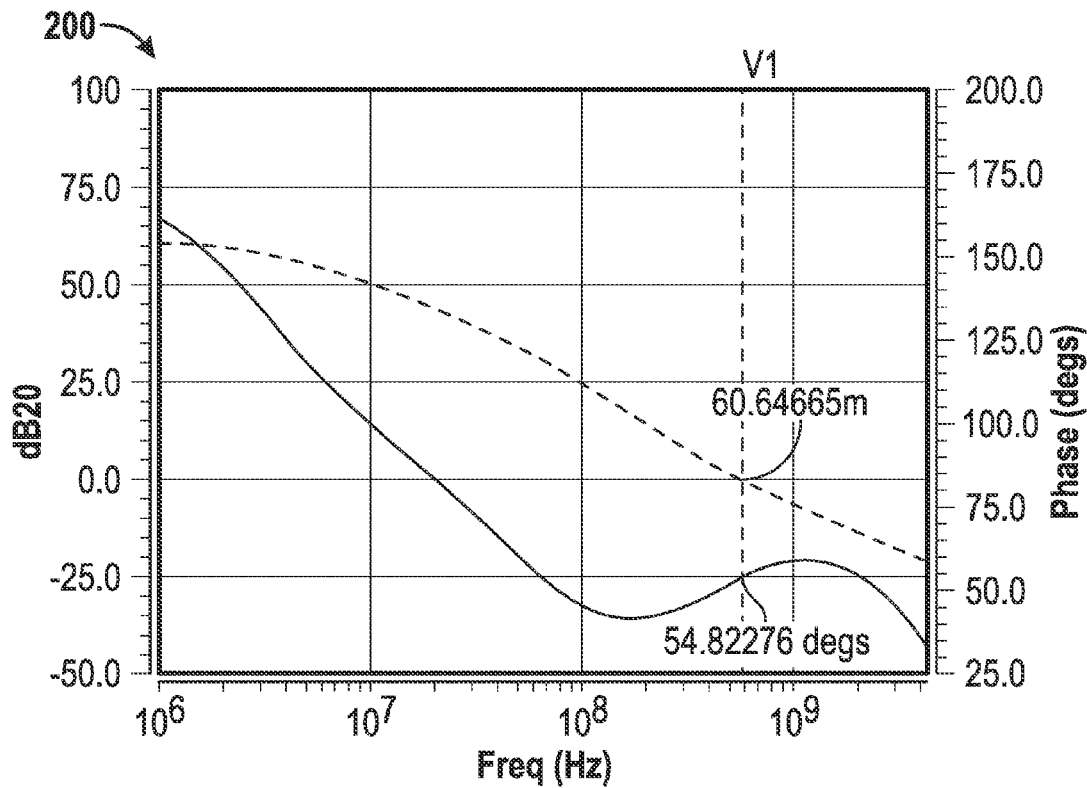
FIG. 4 illustrates a Bode plot of an improved Ahuja-type internal compensation loop, in accordance with the disclosed embodiments.
Figure 5:
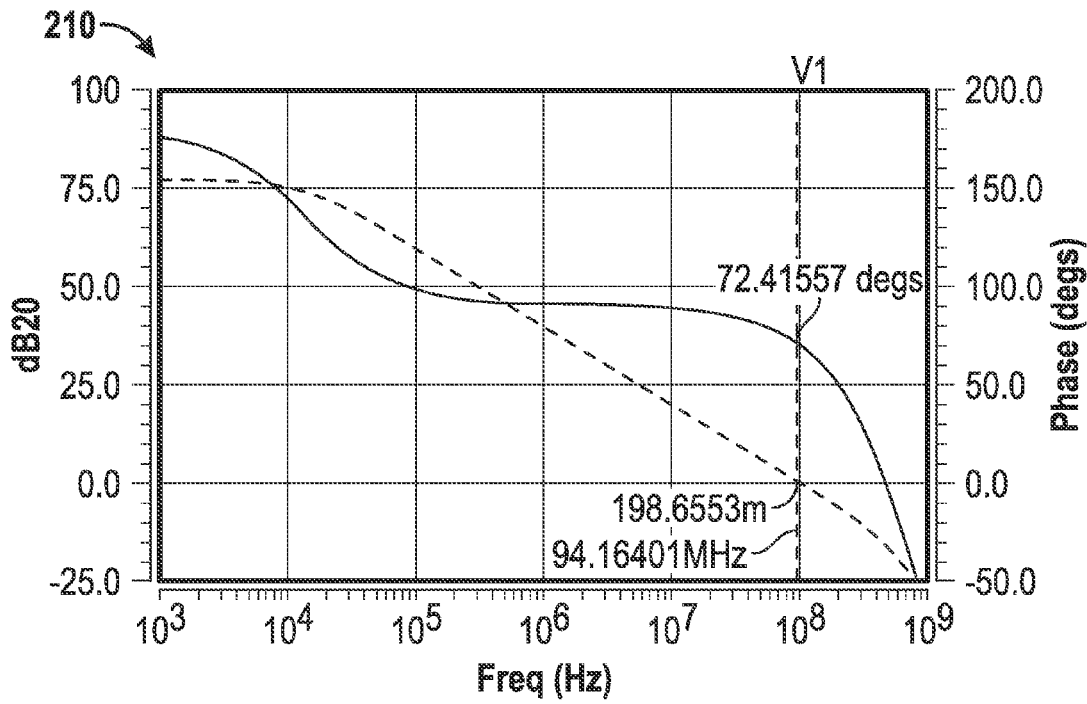
FIG. 5 illustrates a Bode plot of an operational amplifier with improved Ahuja compensation, in accordance with the disclosed embodiments.

FIG. 4 illustrates a Bode plot 200 of an improved Ahuja-type internal compensation loop, in accordance with the disclosed embodiments. The phase margin improvement is apparent (54.8° vs. 8.0° before the improvement). FIG. 5 illustrates a Bode plot 210 of an operational amplifier with improved Ahuja-type compensation, in accordance with the disclosed embodiment.

Figure 1F:
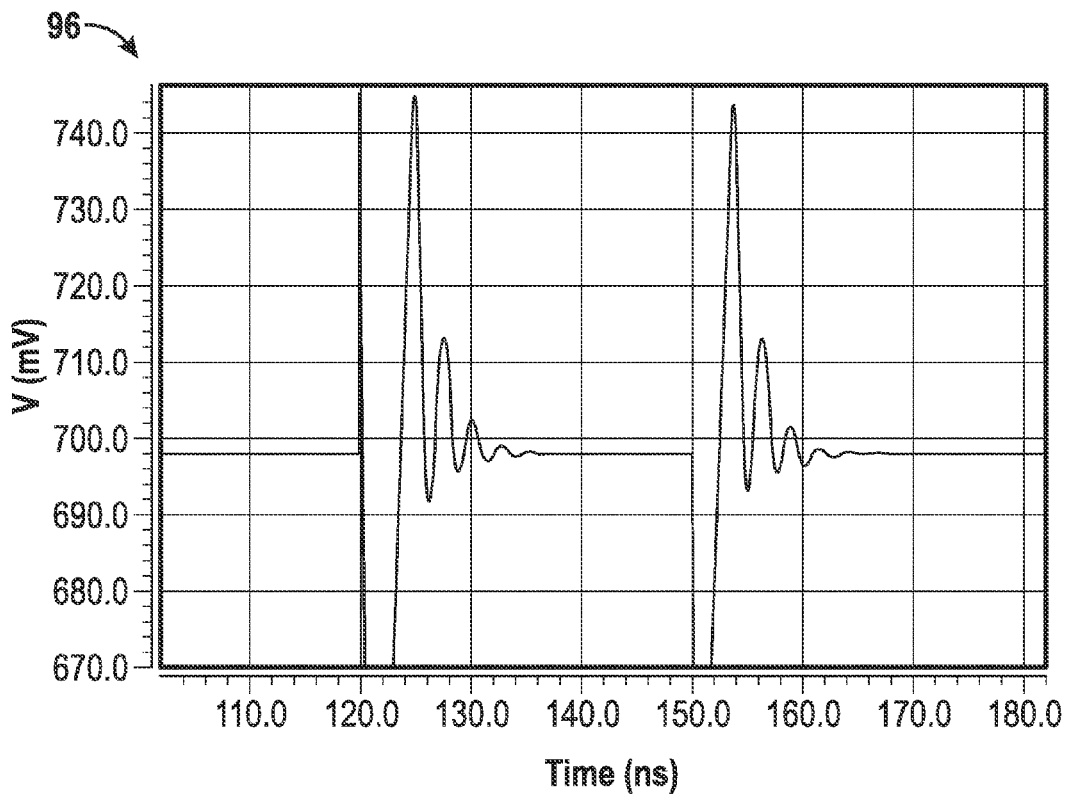
FIG. 1(f) illustrates a plot of the transient response of a prior art operational amplifier with Ahuja-type compensation.
Figure 2:
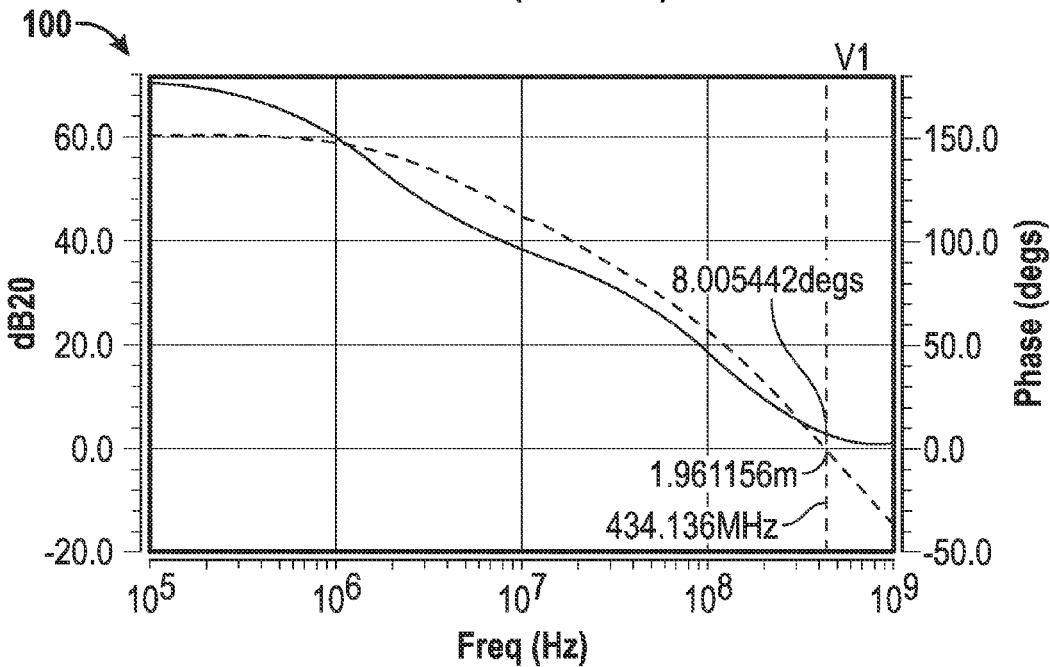
FIG. 2 illustrates a Bode plot of a prior art Ahuja-type internal compensation loop.
Figure 6:
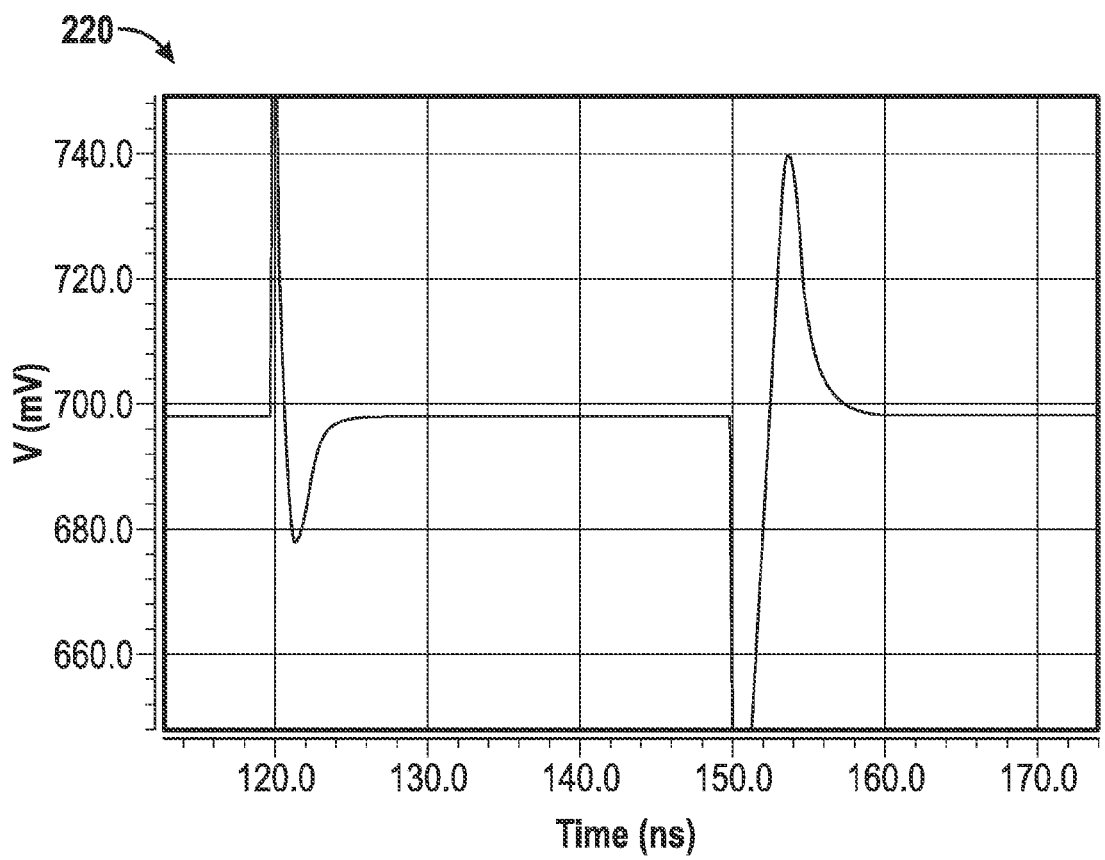
FIG. 6 illustrates a plot of the transient response of an operational amplifier with improved Ahuja-type compensation, in accordance with the disclosed embodiments.

Finally, a plot 220 of the transient response of the operational amplifier global loop according to the disclosed embodiments is shown in FIG. 6. The dramatic improvement demonstrated by plot 220 of FIG. 6 in comparison to the plot 96 of FIG. 1(f) is apparent.

The improvement of an operational amplifier phase margin by including a resistor between the operational amplifier output and significantly capacitive load is a common and widely used approach. In this case, however, the global feedback is connected to the amplifier output, but not directly to the load. The voltage drop across an additional resistor creates an error at the load since only the operational amplifier output node has the accurate voltage.

In the disclosed embodiments, the additional resistor (e.g., resistors 138, 140 shown in FIG. 3) is connected between the amplifier internal node and the amplifier output node. The global feedback is connected directly to the operational amplifier output node and directly to the load of the amplifier, thus the accuracy of the circuit is not compromised.

It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

What is claimed is:

1. An operational amplifier apparatus, comprising:
   at least one output node and an output stage coupled to said at least one output node, said output stage containing an output and a first transistor circuit employed in a first amplification mode, said first transistor circuit having a control node;
   a frequency compensation capacitor coupled between said output of said output stage and said control node of said first transistor circuit via a second transistor circuit employed in a second amplification mode wherein said second transistor circuit comprises a MOS transistor that operates in a common gate amplification mode; and
   a resistor coupling a node of said frequency compensation capacitor and said output of said output stage to said at least one output node of said operational amplifier apparatus.

2. The apparatus of claim 1 wherein said first transistor circuit comprises a MOS transistor that operates in a common source amplification mode.

3. The apparatus of claim 1 wherein said first transistor circuit comprises a bipolar transistor that operates in a common emitter amplification mode.

4. The apparatus of claim 1 wherein said second transistor circuit comprises a bipolar transistor that operates in a common base amplification mode.

5. The apparatus of claim 1 wherein said operational amplifier apparatus further comprises a third transistor circuit acting as a source of a bias current for the output stage.

6. The apparatus of claim 5 wherein said third transistor circuit acts as a current source and is connected to a common node that connects said output of said output stage, said frequency compensation capacitor, said second transistor circuit, and said frequency compensation capacitor with said resistor.

7. The apparatus of claim 5 wherein said third transistor circuit is connected to said at least one output node of said operational amplifier apparatus.

8. A method of configuring an operational amplifier, said method comprising:
   coupling at least one output node of said operational amplifier to an output stage;
   arranging said output stage to contain an output and a first transistor circuit employed in a first amplification mode, said first transistor circuit having a control node;
   connecting a frequency compensation capacitor between said output of said output stage and said control node of said first transistor circuit via a second transistor circuit employed in a second amplification mode;
   configuring said second transistor circuit to comprise a MOS transistor that operates in a common gate amplification mode; and
   providing a resistor that couples a node of said frequency compensation capacitor and said output of said output stage to said at least one output node of said operational amplifier.

9. The method of claim 8 further comprising configuring said first transistor circuit to comprise a MOS transistor that operates in a common source amplification mode.

10. The method of claim 8 further comprising configuring said first transistor circuit to comprise a bipolar transistor that operates in a common emitter amplification mode.

11. The method of claim 8 further comprising configuring said second transistor circuit to comprise a bipolar transistor that operates in a common base amplification mode.

12. The method of claim 8 further comprising configuring said operational amplifier to comprise a third transistor circuit acting as a source of a bias current for the output stage.

13. The method of claim 12 further comprising:
connecting said third transistor circuit acting as a source of a bias current to a common node that connects said output of said output stage, said second transistor circuit, and said frequency compensation capacitor with said resistor.

14. The method of claim 12 further comprising:
connecting said third transistor circuit to said at least one output node of said operational amplifier.

15. A system for an operational amplifier, said system comprising:
at least one output node and an output stage coupled to said at least one output node, said output stage containing an output and a first transistor circuit employed in a first amplification mode, said first transistor circuit having a control node;
a frequency compensation capacitor coupled between said output of said output stage and said control node of said first transistor circuit via a second transistor circuit employed in a second amplification mode;
a resistor coupling a node of said frequency compensation capacitor and said output of said output stage to said at least one output node or said operational amplifier; and
a third transistor circuit acting as a source of a bias current for said output stage wherein said first transistor circuit comprises a MOS transistor that operates in a common source amplification mode or wherein said first transistor circuit core rises a bipolar transistor that operates in a common emitter amplification mode; and
wherein said second transistor circuit comprises a MOS transistor that operates in a common gate amplification mode or wherein said second transistor circuit comprises a bipolar transistor that operates in a common base amplification mode.

16. The system of claim 15 wherein said resistor is connected to said at least one output node of said operational amplifier and wherein said frequency compensation capacitor is connected to the other node of said resistor at a common node that connects said output of said output stage, said third transistor circuit acting as a current source, said second transistor circuit, and said frequency compensation capacitor with said resistor.

17. The system of claim 15 wherein said third transistor circuit is connected to said at least one output node of said operational amplifier and wherein said frequency compensation capacitor is connected to the other node of said resistor at a common node that connects said output of said output stage, said second transistor circuit, and said frequency compensation capacitor with said resistor.

* * * * *